(12) United States Patent
Sun et al.

(10) Patent No.: US 10,854,503 B2
(45) Date of Patent: Dec. 1, 2020

(54) SEMICONDUCTOR STRUCTURE WITH AIR GAP AND METHOD SEALING THE AIR GAP

(71) Applicant: Taiwan Semiconductor Manufacturing Co., Ltd., Hsin-Chu (TW)

(72) Inventors: Hung-Chang Sun, Kaohsiung (TW); Akira Mineji, Hsinchu County (TW); Ziwei Fang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/262,235

(22) Filed: Jan. 30, 2019

(65) Prior Publication Data

US 2020/0020567 A1 Jan. 16, 2020

Related U.S. Application Data

(60) Provisional application No. 62/698,487, filed on Jul. 16, 2018.

(51) Int. Cl.

| H01L 21/764 | (2006.01) |
|---|---|
| H01L 29/51 | (2006.01) |
| H01L 29/66 | (2006.01) |
| H01L 21/265 | (2006.01) |
| H01L 21/311 | (2006.01) |
| H01L 21/3105 | (2006.01) |
| H01L 21/266 | (2006.01) |

(52) U.S. Cl.
CPC .......... *H01L 21/764* (2013.01); *H01L 21/266* (2013.01); *H01L 21/26586* (2013.01); *H01L 21/31053* (2013.01); *H01L 21/31144* (2013.01); *H01L 29/515* (2013.01); *H01L 29/6656* (2013.01)

(58) Field of Classification Search
CPC ............. H01L 21/764; H01L 21/26586; H01L 21/31144; H01L 21/31053; H01L 21/266; H01L 29/515; H01L 29/6656
See application file for complete search history.

(56) References Cited

U.S. PATENT DOCUMENTS

| 5,736,446 | A | * | 4/1998 | Wu ..................... H01L 21/2254 257/E21.148 |
|---|---|---|---|---|
| 8,772,109 | B2 | | 7/2014 | Colinge |
| 8,785,285 | B2 | | 7/2014 | Tsai et al. |
| 8,816,444 | B2 | | 8/2014 | Wann et al. |
| 8,823,065 | B2 | | 9/2014 | Wang et al. |

(Continued)

*Primary Examiner* — Sitaramarao S Yechuri
(74) *Attorney, Agent, or Firm* — Haynes and Boone, LLP

(57) ABSTRACT

The present disclosure provides a method of fabricating a semiconductor structure in accordance with some embodiments. The method includes receiving a substrate having an active region and an isolation region; forming gate stacks on the substrate and extending from the active region to the isolation region; forming an inner gate spacer and an outer gate spacer on sidewalls of the gate stacks; forming an interlevel dielectric (ILD) layer on the substrate; removing the outer gate spacer in the isolation region, resulting in an air gap between the inner gate spacer and the ILD layer; and performing an ion implantation process to the ILD layer, thereby expanding the ILD layer to cap the air gap.

20 Claims, 12 Drawing Sheets

(56) References Cited

U.S. PATENT DOCUMENTS

| | | |
|---|---|---|
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2005/0167001 A1* | 8/2005 | Krautbauer ............. C30B 15/04 148/33 |
| 2010/0151638 A1* | 6/2010 | Clevenger ......... H01L 21/31144 438/197 |

* cited by examiner

SEMICONDUCTOR STRUCTURE WITH AIR GAP AND METHOD SEALING THE AIR GAP

PRIORITY DATA

This application claims the benefit of U.S. Prov. App. No. 62/698,487 entitled "Semiconductor Structure with Air gap and Method Sealing the Air Gap," filed Jul. 16, 2018, herein incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. ICs may include electronic components, such as transistors, capacitors, or the like, formed on a substrate. Interconnect structures, such as vias and conductive lines, are then formed over the electronic components to provide connections between the electronic components and to provide connections to external devices. To reduce the parasitic capacitance of the interconnect structures, the interconnect structures may be formed in dielectric layers including a low-k dielectric material. However, even with the low-k dielectric material, the parasitic capacitance is still not tolerable due to the small dimensions in the advanced technology nodes. Accordingly, what is needed is a circuit structure and a method making the same to address the above issues.

BRIEF DESCRIPTION OF THE DRAWINGS

Aspects of the present disclosure are best understood from the following detailed description when read with the accompanying figures Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
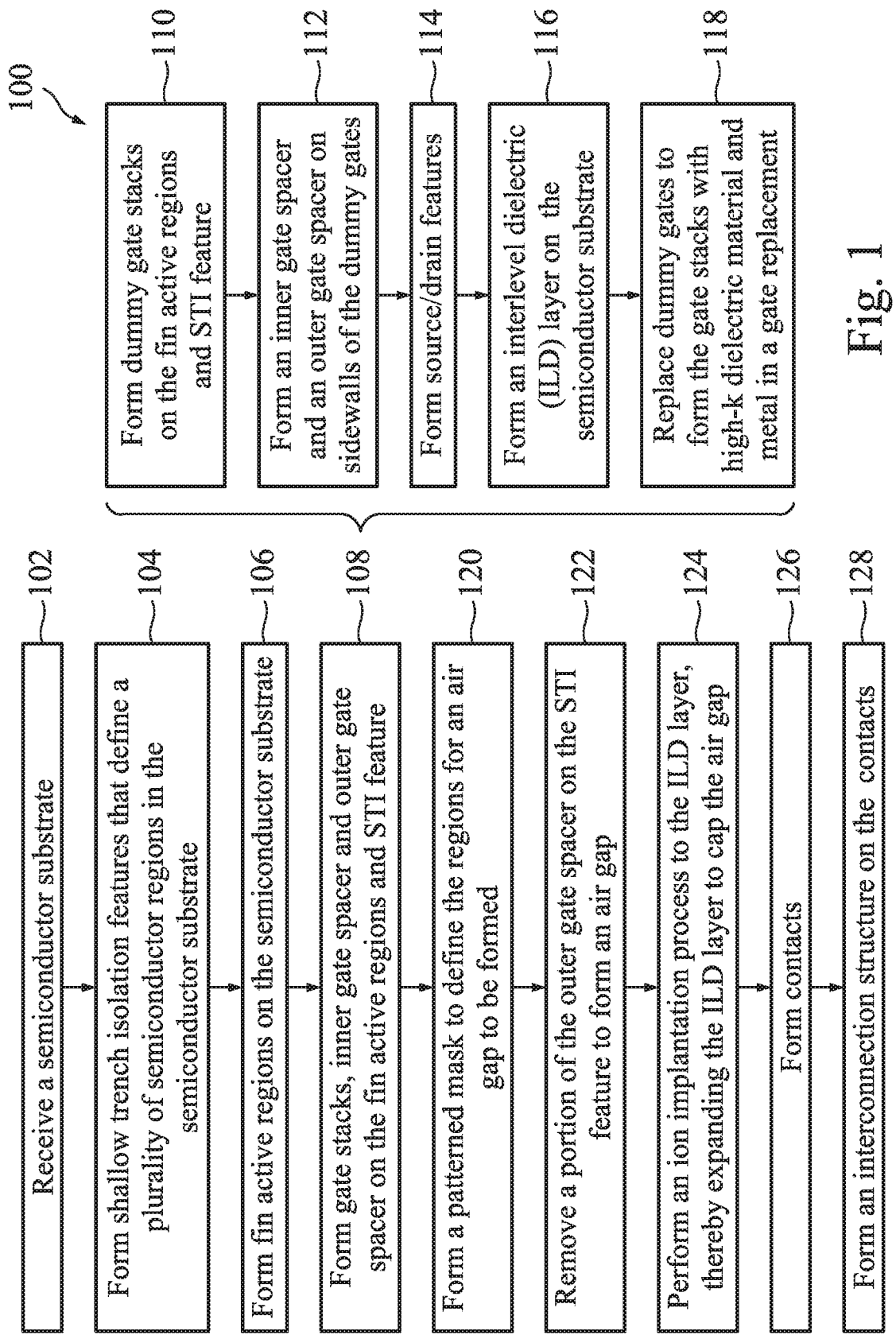
FIG. 1 is a flowchart illustrating an embodiment of a method of forming a semiconductor structure or portion thereof in accordance with aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure with an air gap between the interlayer dielectric (ILD) layer and the gate spacer. The present disclosure also provides a method to forming and sealing the air gap. Especially, the method includes removing a sacrificial gate spacer on the shallow trench isolation (STI) feature and performing an ion implantation to the ILD layer, thereby expanding a top portion of the ILD layer to cap the air gap.

Figure 2A:
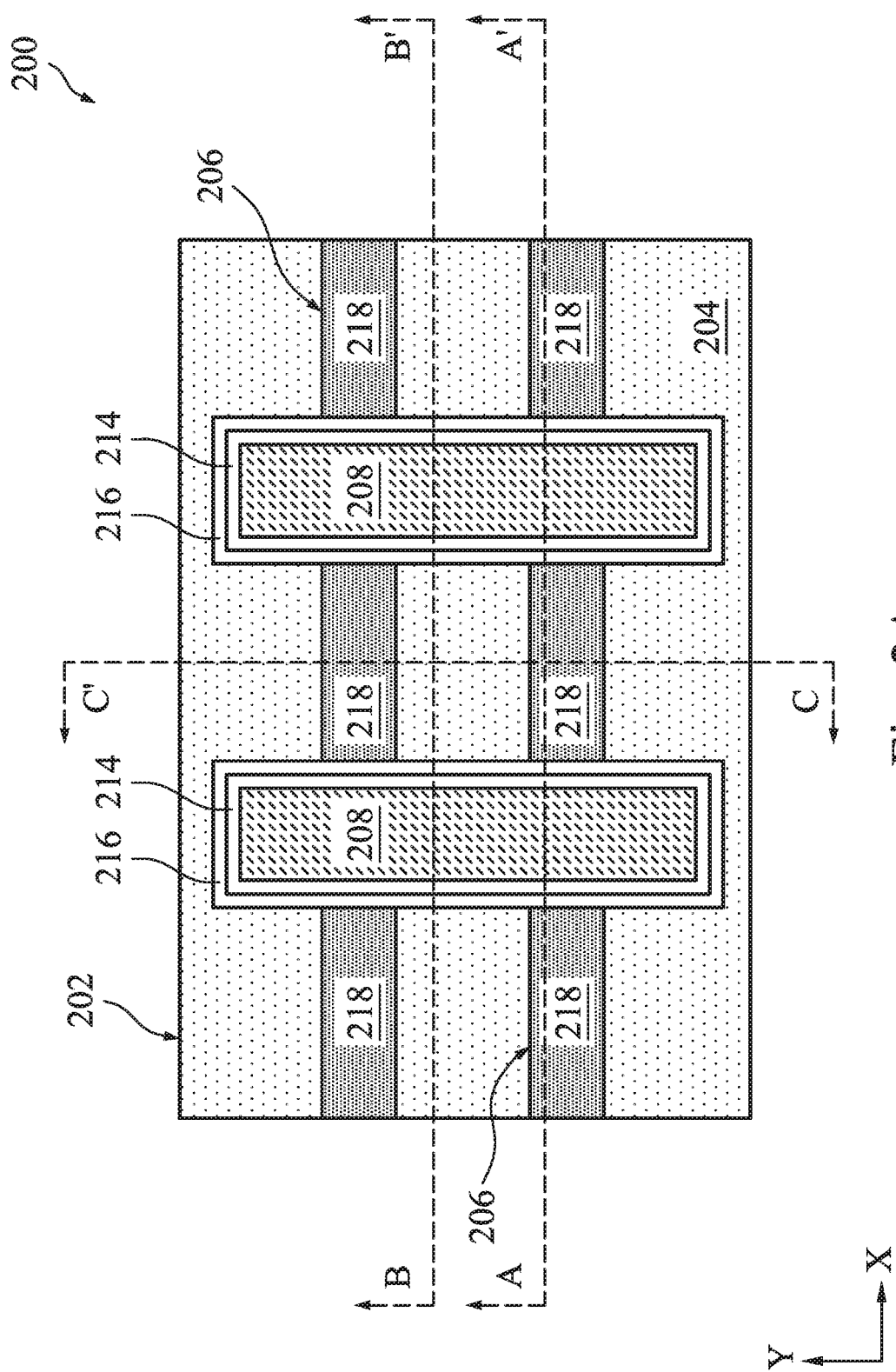
FIG. 2A is a top view of a semiconductor structure at a fabrication stage constructed according to some embodiments.
Figure 2B:
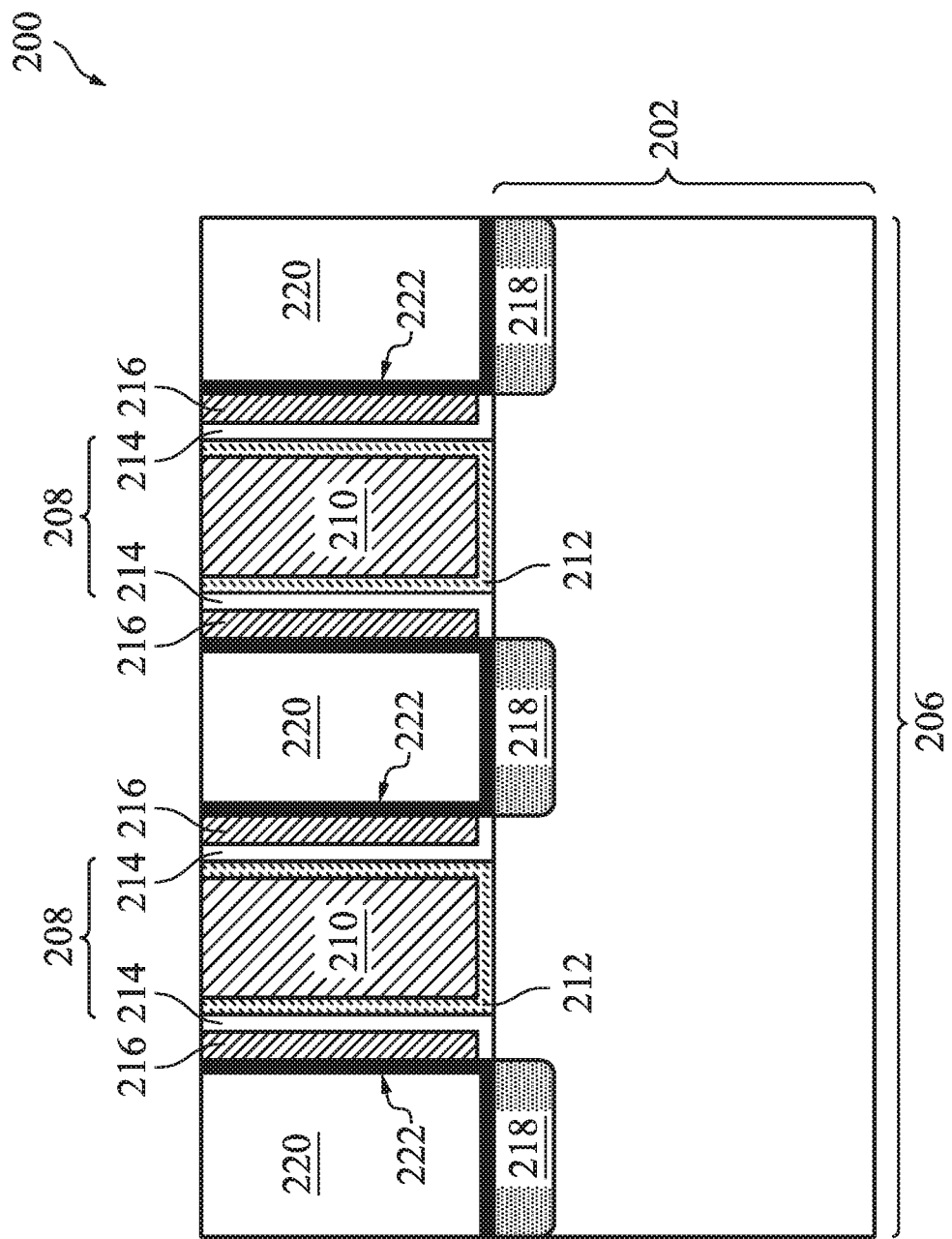
FIGS. 2B, 2C and 2D are cross-sectional views of the semiconductor structure of FIG. 2A along the dashed lines AA', BB' and CC', respectively, constructed according to some embodiments.
Figure 2C:
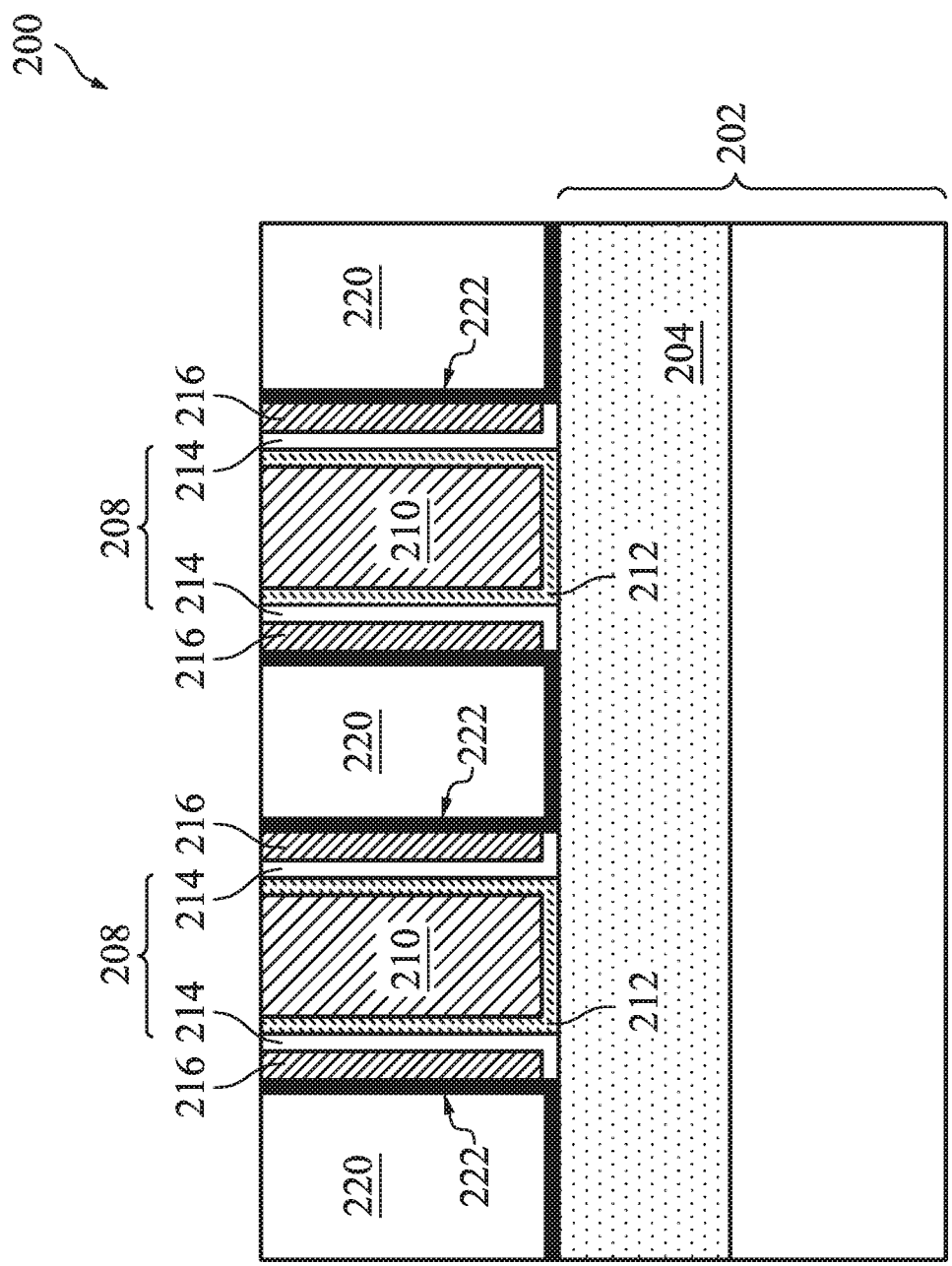
Figure 2D:
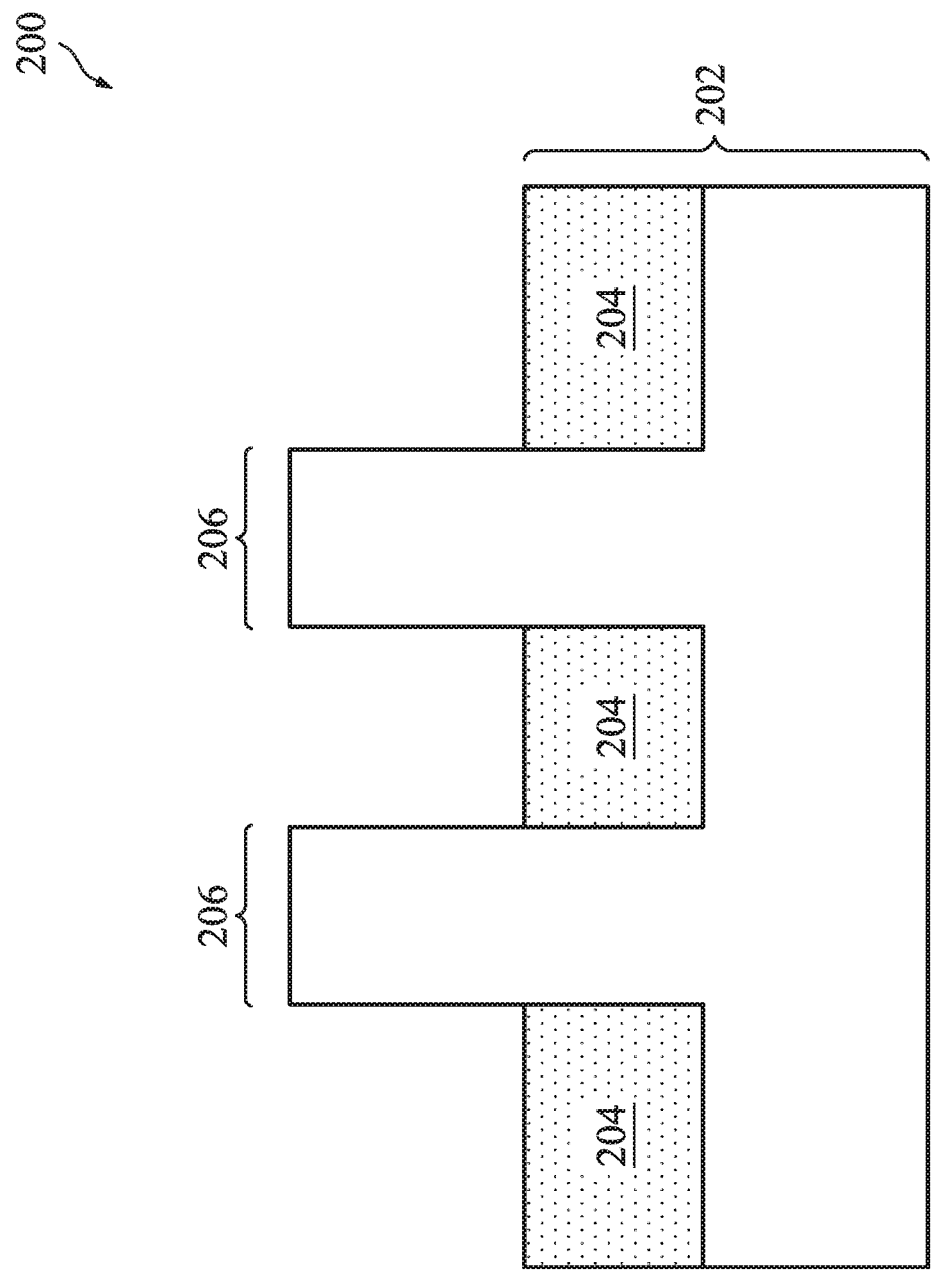
Figure 3:
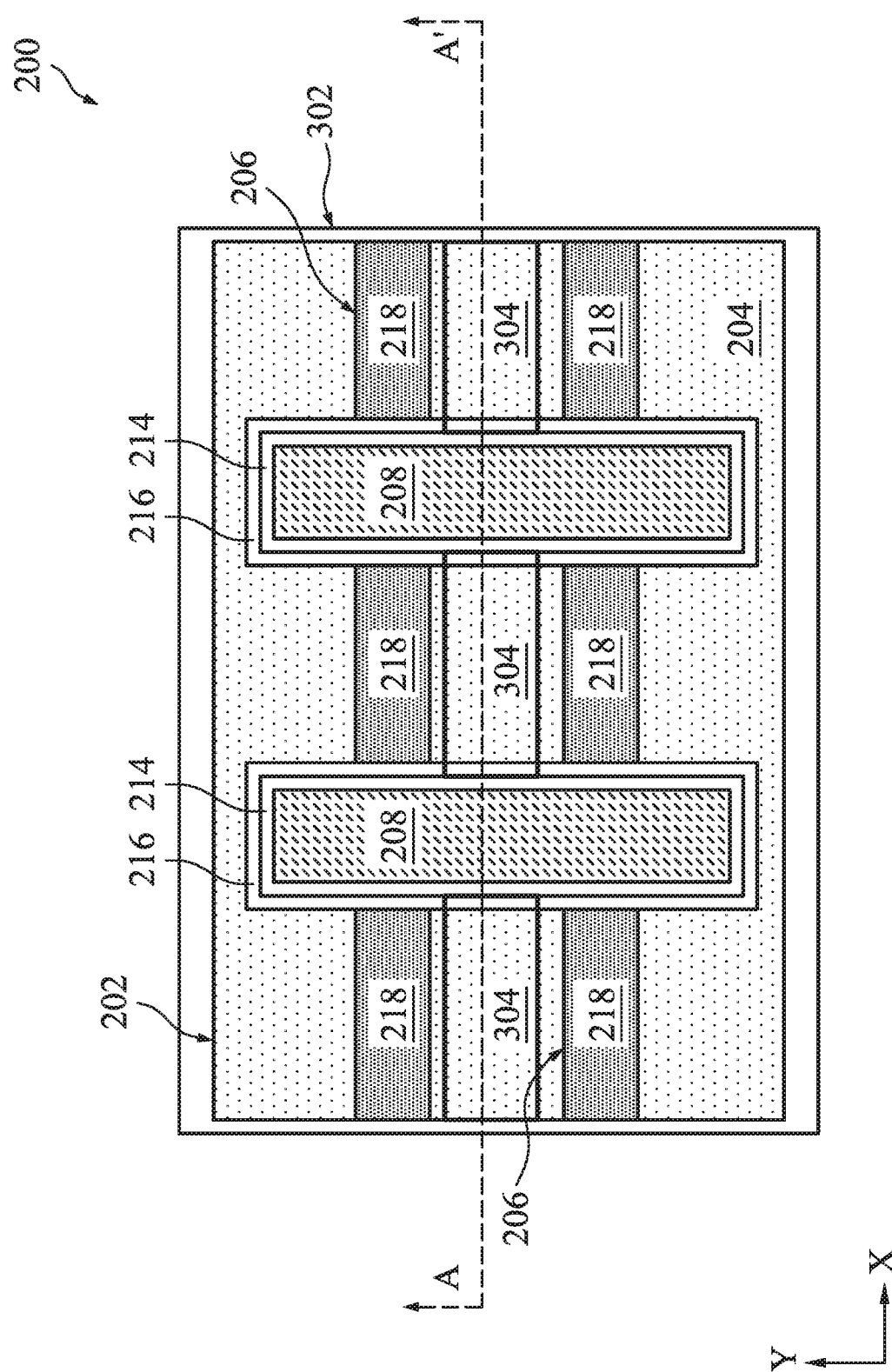
FIG. 3 is a top view of the semiconductor structure at a different fabrication stage constructed according to some embodiments.
Figure 7:
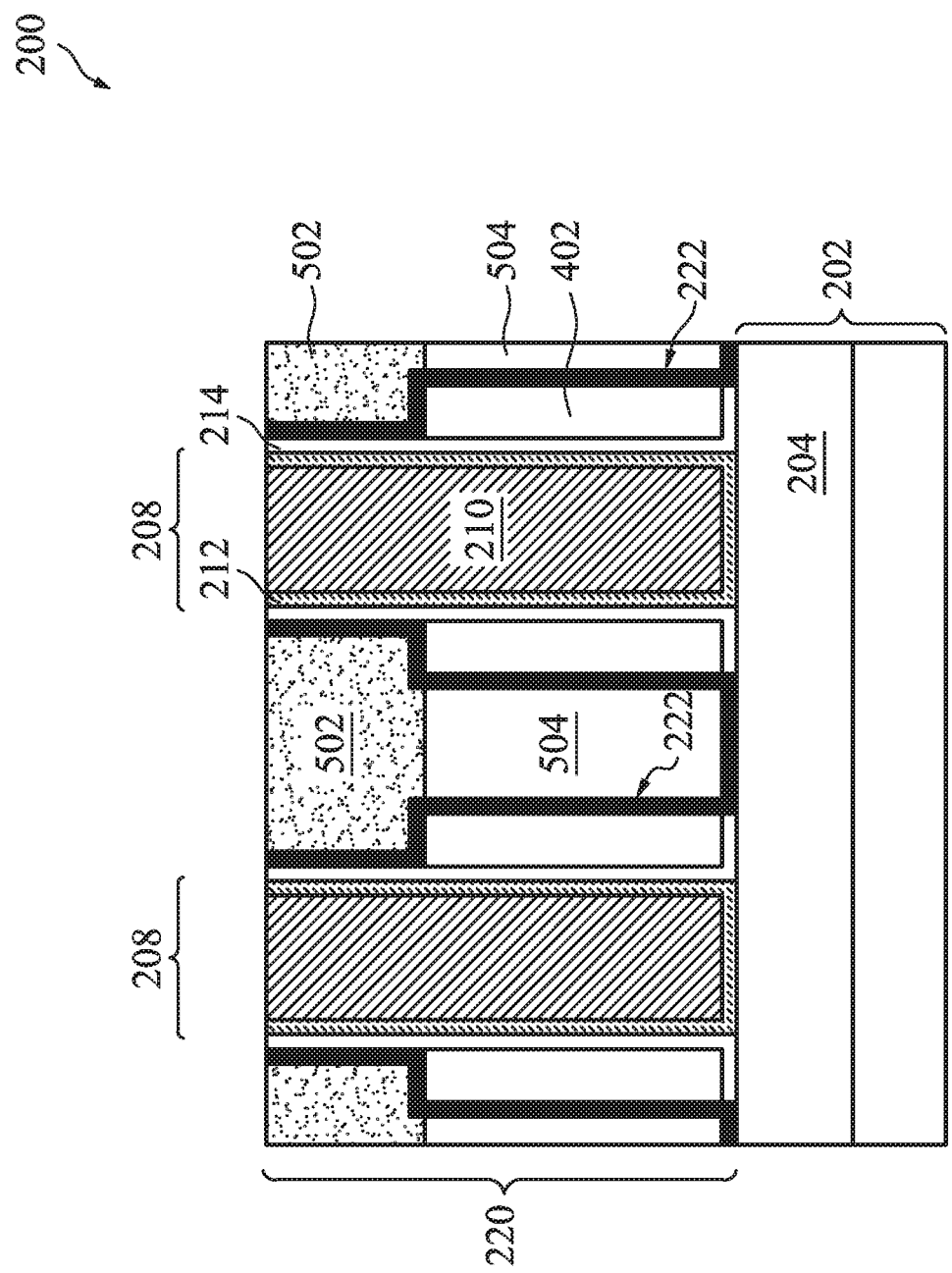
Figure 8:
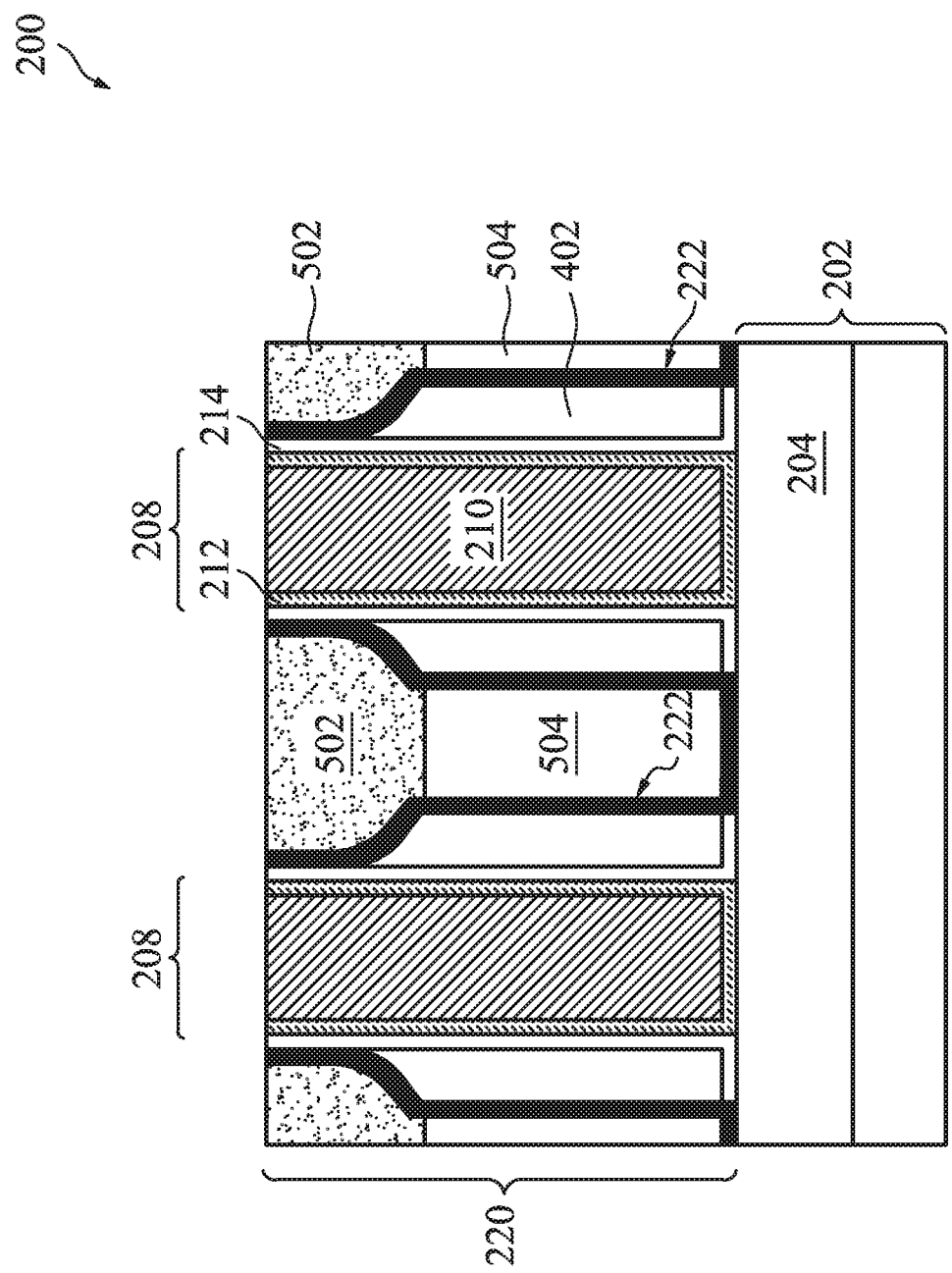
Figure 9:
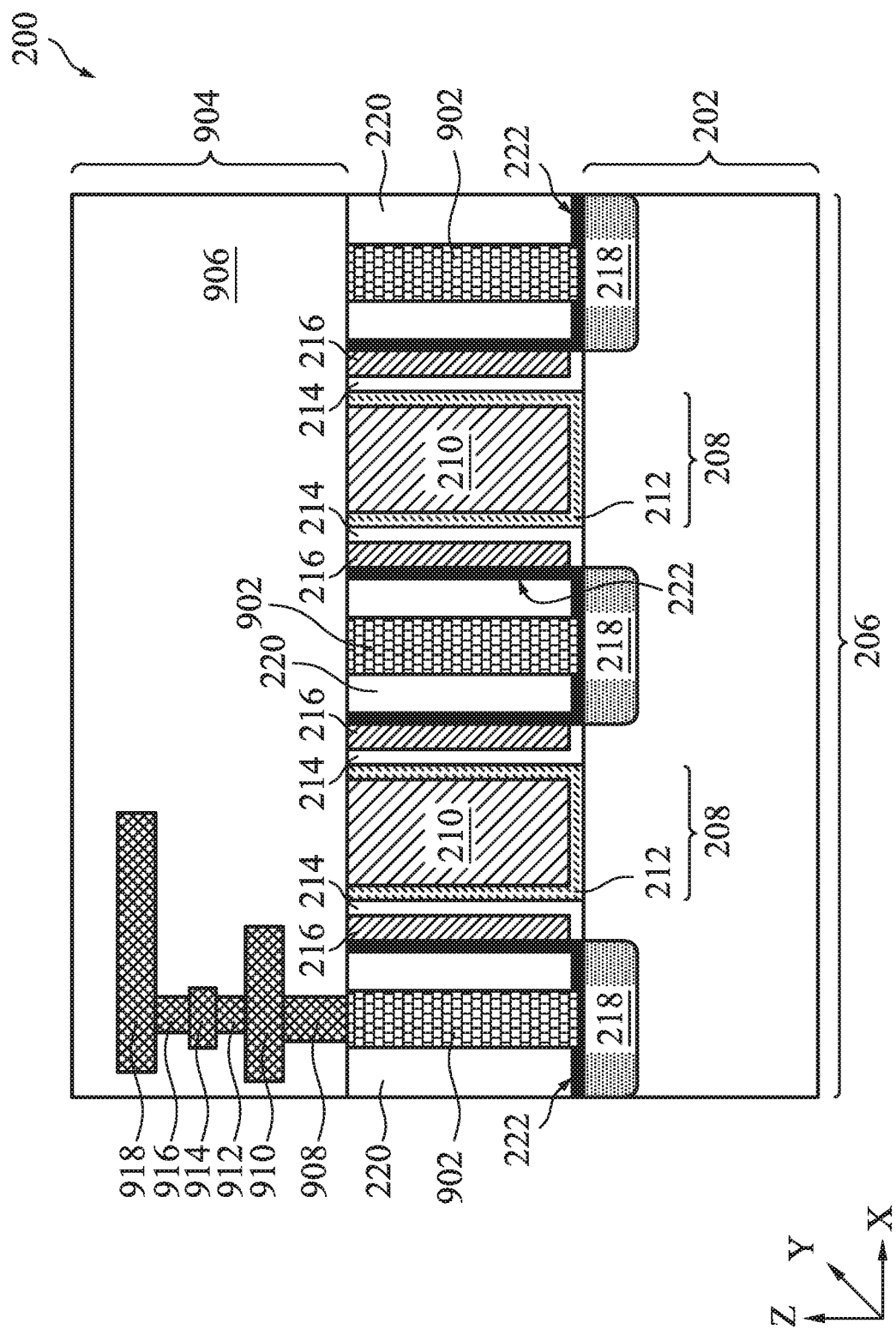

Referring now to FIG. 1, illustrated therein is a flowchart of one embodiment of a method 100 used to fabricate a semiconductor structure with an air gap disposed between the gate spacer and the ILD layer and caped by the expanded ILD layer. FIG. 2A is a top view; FIG. 2B is a sectional view along the dashed line AA'; FIG. 2C is a sectional view along the dashed line BB'; and FIG. 2D is a sectional view along the dashed line CC' of the semiconductor structure 200 at one fabrication stage in accordance with some embodiments. FIG. 3 is a top view at a later fabrication stage. FIGS. 4-8 are sectional views of the semiconductor structure 200 at various fabrication stages along the dashed line BB', and FIG. 9 is a sectional view of the semiconductor structure 200 at a fabrication stage along the dashed line AA' constructed according to various aspects of the present disclosure in some embodiments. The method 100 and the IC structure 200 are collectively described with reference to FIGS. 1-9.

Referring to FIGS. 2A, 2B, 2C and 2D, the method 100 begins with block 102 by providing a semiconductor substrate 202. The semiconductor substrate 202 includes silicon. In some other embodiments, the semiconductor substrate 202 includes germanium, silicon germanium or other proper semiconductor materials. The semiconductor substrate 202 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor substrate 202 also includes various doped regions such as n-well and p-wells. In one embodiment, the semiconductor substrate 202 includes an epitaxy (or epi) semiconductor layer. In another embodiment, the semiconductor substrate 202 includes a buried dielectric material layer for isolation formed by a proper technology, such as a technology referred to as separation by implanted oxygen (SIMOX). In some embodiments, the semiconductor substrate 202 may be a semiconductor on insulator, such as silicon on insulator (SOI).

Still referring to FIGS. 2A through 2D, the method 100 proceeds to an operation 104 by forming shallow trench isolation (STI) features 204 on the semiconductor substrate 202. In some embodiments, the STI features 204 are formed by a procedure that includes an etching process to form trenches; filling the trenches with dielectric material by deposition; and polishing to remove the excessive dielectric material and planarize the top surface. The etching process may include one or more etching steps applied to the semiconductor substrate 202 through openings of a soft mask (such as a photoresist layer formed by a lithography process), or a hard mask that is patterned by a lithography process and etching.

The etching process is applied to the semiconductor substrate 202 through the openings of a patterned mask layer, thereby forming trenches. The etching processes may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with particular trench profile for improved device performance and pattern density. In some examples, the semiconductor material of the substrate may be etched by a dry etching process using a fluorine-based etchant. One or more dielectric material is filled in the trenches by deposition. Suitable fill dielectric materials include semiconductor oxides, semiconductor nitrides, semiconductor oxynitrides, fluorinated silica glass (FSG), low-K dielectric materials, and/or combinations thereof. In various embodiments, the dielectric material is deposited using a HDP-CVD process, a sub-atmospheric CVD (SACVD) process, a high-aspect ratio process (HARP), a flowable CVD (FCVD), and/or a spin-on process. Then, a chemical mechanical polishing/planarization (CMP) process is applied to remove the excessive dielectric material and planarize the top surface of the semiconductor structure 200.

After the operation 104, active regions are defined on the semiconductor substrate 202 and are surrounded by the STI features 204. In some embodiments, the active regions are 3-dimensional, such as fin active regions 206, formed by an operation 106.

Referring to FIGS. 2A through 2D, the method 100 proceeds to the operation 106 by forming the fin active regions 206. The fin active regions 206 are extruded above the STI features 204, as illustrated in FIG. 2D. In some embodiments, the operation 106 includes recessing the STI features 204. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. The fin active regions 206 are oriented along a first direction (X direction) and spaced from each other in a second direction (Y direction).

Various doping processes may be applied to the semiconductor substrate 202 to form various doped wells, such as n-wells and p-wells at the present stage or before the operation 106. Various doped wells may be formed in the semiconductor substrate 202 by respective ion implantations.

Still referring to FIGS. 2A-2D, the method 100 proceeds to an operation 108 by forming gate stacks 208 on the semiconductor substrate 202. Each of the gate stacks 208 further includes a gate electrode 210 and a gate dielectric layer 212. In the present embodiment, the gate stacks 208 have elongated shapes and are oriented in the second direction (Y direction). Each of the gate stacks 208 may be disposed over multiple fin active regions 206. Especially, the gate stacks 208 are disposed on the fin active regions 206 and extended onto the STI features 204. Thus, each of the gate stacks 208 includes portions landing on the fin active regions 206 and portions landing on the STI features 204. The operation 108 also includes forming an inner gate spacer 214, an outer gate spacer 216, source/drain (S/D) features 218, and an interlevel dielectric (ILD) layer 220. The operation 108 further includes multiple operations according to some embodiments. In the present embodiment, the operation 108 further includes operations 110, 112, 114, 116 and 118, which are further described below with reference to FIG. 1 and FIGS. 2A-2D.

The method 100 (or the operation 108) includes the operation 110 by forming dummy gates (not shown in FIGS. 2A-2D since those are to be replaced by the gate stacks 208 at the operation 118 and are located at the locations of the gate stacks 208). The dummy gates may include a dielectric material layer (such as silicon oxide) and polysilicon. The formation of the dummy gates includes depositing the dummy gate materials (such as forming a silicon oxide layer and depositing a polysilicon layer); and patterning the dummy gate materials by a lithographic process and etching. A hard mask may be formed on the dummy gate materials and is used as an etch mask during the formation of the dummy gates. The gate hard mask may include any suitable material, such as a silicon oxide, a silicon nitride, a silicon carbide, a silicon oxynitride, other suitable materials, and/or combinations thereof. In one embodiment, the gate hard mask includes multiple films, such as silicon oxide and silicon nitride. In some embodiments, the patterning process to form the dummy gates includes forming a patterned photoresist layer on the hard mask by lithography process; etching the hard mask using the patterned resist layer as an etch mask; and etching the gate materials to form the dummy gates using the patterned hard mask as an etch mask.

The method 100 also includes the operation 112 by forming gate spacers, which include the inner gate spacer 214 and the outer gate spacer 216, on sidewalls of the dummy gates. The gate spacers (the inner gate spacer 214 and the outer gate spacer 216) may include any suitable dielectric material, such as a semiconductor oxide, a semiconductor nitride, a semiconductor carbide, a semiconductor oxynitride, other suitable dielectric materials, and/or combinations thereof. The inner gate spacer 214 includes a first dielectric material and the outer gate spacer 216 includes a second dielectric material different from the first dielectric material in composition to achieve etch selectivity. In some embodiments, the first dielectric material includes one of SiCN, SiOCN, SiOC, and a combination thereof; and the second dielectric material includes a low-k dielectric material, such as fluorinated silica glass (FSG), carbon doped silicon oxide, Xerogel, Aerogel, amorphous fluorinated carbon, polyimide, other suitable low-k dielectric material, or a combination thereof. The formation of the gate spacers includes depositing the first and second dielectric materials and anisotropic etching, such as dry etching.

The method 100 proceeds to an operation 114 by forming the S/D features 218. The S/D features 218 may include both light doped drain (LDD) features and heavily doped source and drain (S/D). For example, each field effect transistor includes source and drain features formed on the respective fin active region and interposed by the corresponding gate stack 208. A channel is formed in the fin active region in a portion that is underlying the gate stack and spans between the corresponding S/D features 218.

In some embodiments, the S/D features 218 are raised S/D features formed by selective epitaxy growth for strain effect with enhanced carrier mobility and device performance. The dummy gates, the inner gate spacer 214 and the outer gate spacer 216 constrain the S/D features 218 to be formed within source and drain regions. In some embodiments, the S/D features 218 are formed by one or more epitaxy or epitaxial growth, whereby Si features, SiGe features, SiC features, and/or other suitable features are grown in a crystalline state on the fin active regions 206. Alternatively, an etching process is applied to recess the source and drain regions before the epitaxy growth. A suitable epitaxy growth includes CVD deposition techniques (e.g., vapor-phase epitaxy (VPE) and/or ultra-high vacuum CVD (UHV-CVD), molecular beam epitaxy, and/or other suitable processes. The epitaxy growth may use gaseous and/or liquid precursors, which interact with the composition of the fin active regions 206.

The S/D features 218 may be in-situ doped during the epitaxy process by introducing doping species including: p-type dopants, such as boron or $BF_2$; n-type dopants, such as phosphorus or arsenic; and/or other suitable dopants including combinations thereof. If the S/D features 218 are not in-situ doped, an implantation process (i.e., a junction implant process) is performed to introduce the corresponding dopant into the S/D features 218. In an embodiment, the S/D features 218 in an n-type field effect transistor (nFET) include SiC or Si doped with phosphorous, while those in a p-type field effect transistor (pFET) include Ge or SiGe doped with boron. In some other embodiments, the S/D features 218 include more than one semiconductor material layers. For example, a silicon germanium layer is epitaxially grown on and a silicon layer is epitaxially grown on the silicon germanium layer. One or more annealing processes may be performed thereafter to activate the S/D features 218. Suitable annealing processes include rapid thermal annealing (RTA), laser annealing processes, other suitable annealing technique or a combination thereof.

The method 100 proceeds to an operation 116, in which an ILD layer 220 is formed on the semiconductor substrate 202, covering the S/D features 218. The ILD layer 220 is not shown in FIG. 2A so that those features (such as the S/D features 218) underlying the ILD layer 220 are viewable. The ILD layer 220 surrounds the dummy gates, the inner gate spacer 214 and the outer gate spacer 216 allowing the dummy gates to be removed and a replacement gate to be formed in the resulting gate cavity. In the present embodiment, the ILD layer 220 is chosen with a composition to effectively achieve the expansion for air gap sealing by an ion implantation process. The ILD layer 220 includes one or more suitable dielectric material, such as SiN, SiOC, SiOCN, SiCN, Si, SiGe, $SiO_2$, $TiO_2$, $Al_2O_3$, Ge, W, TaN, TiN, $HfO_2$, $ZrO_2$, $La_2O_3$, or a combination thereof. The formation of the ILD layer 220 includes deposition (such as CVD, or high-density plasma CVD-HDPCVD) and CMP to provide a planarized top surface. In some embodiments, the operation 116 also includes forming an etch stop layer 222 to provide etch stop during the operations to form contacts to the S/D features 218. The etch stop layer 222 is different from the ILD layer 220 in composition to have desired etch selectivity. In some embodiments, the etch stop layer 222 includes one of SiCN, SiOCN, SiOC, SiN, and a combination thereof.

The method 100 proceeds to an operation 118 for gate replacement. In the operation 118, the dummy gates are replaced by the gate stacks 208 having high-k dielectric material and metal. The operation 118 includes performing an etching process to selectively remove the dummy gates, resulting in gate cavities; and depositing gate materials (including high-k dielectric material and metal) in the gate cavities; and performing a CMP process to remove the excessive gate materials from the ILD layer 220. Especially, the gate stacks 208 includes the gate electrode 210 and the gate dielectric layer 212. The gate electrode 210 includes metal, metal alloy or a combination thereof. The gate dielectric layer 212 includes a high-k dielectric material. Since the gate dielectric layer 212 is conformally deposited in the gate cavities and is therefore U-shaped as illustrated in FIGS. 2B and 2C.

The gate dielectric layer 212 and the gate electrode 210 each may include a plurality of sub-layers. In some embodiments, the gate dielectric layer 212 includes a high-k dielectric material that is a metal oxide or metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba, Sr)$TiO_3$ (BST), $Al_2O_3$, $Si_3N_4$, oxynitrides (SiON), or other suitable high-k dielectric materials. The gate dielectric layer 212 may further includes an interfacial layer sandwiched between the high-k dielectric material layer and the fin active region. The interfacial layer may include silicon oxide, silicon nitride, silicon oxynitride, and/or other suitable material. The interfacial layer is deposited by a suitable method, such as ALD, CVD, ozone oxidation, etc. The high-k dielectric layer is deposited on the interfacial layer (if the interfacial layer presents) by a suitable technique, such as ALD, CVD, metal-organic CVD (MOCVD), PVD, thermal oxidation, combinations thereof, and/or other suitable techniques.

The gate electrode 210 may include Ti, Ag, Al, TiAlN, TaC, TaCN, TaSiN, Mn, Zr, TiN, TaN, Ru, Mo, Al, WN, Cu, W, or any suitable materials. In some embodiments, different metal materials are used for nFETs and pFETs with respective work functions. For example, the gate electrode 210 may include a capping layer, a work function metal layer, and a filling metal layer. In furtherance of the embodiments, the capping layer includes titanium nitride, tantalum nitride, or other suitable material, formed by a proper deposition technique such as ALD. The filling metal layer includes aluminum, copper, silicide, suitable other metal, or metal alloy deposited physical vapor deposition (PVD) or other suitable deposition technology, The work functional metal layer includes a conductive layer of metal or metal alloy with proper work function such that the corresponding FET is enhanced for its device performance. The work function (WF) metal layer is different for a pFET and a nFET, respectively referred to as an n-type WF metal and a p-type WF metal. The choice of the WF metal depends on the FET to be formed on the active region. For example, an n-type WF metal is a metal having a first work function such that the threshold voltage of the associated nFET is reduced. For example, the n-type WF metal has a work function of about 4.2 eV or less. A p-type WF metal is a metal having a second work function such that the threshold voltage of the associated pFET is reduced. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In some embodiments, the p-type WF metal includes titanium nitride (TiN) or tantalum nitride (TaN). In other embodiments, the p-type WF metal includes TiN, TaN, tungsten nitride (WN), titanium aluminum (TiAl), or combinations thereof.

Referring to FIG. 3, the method 100 may include an operation 120 to form a patterned mask layer 302 on the semiconductor structure 200 with openings 304 to define the regions where one or more air gap is to be formed. In the present embodiment, the air gap is only formed on the STI features 204 but not on the fin active regions 206. FIG. 3 is a top view of the semiconductor structure 200. The patterned mask layer 302 is illustrated in FIG. 3 as transparent for better view. The patterned mask layer 302 may be a soft mask, such as photoresist formed by a lithography process; or alternatively be a hard mask formed by deposition, lithography process and etching.

Figure 4:
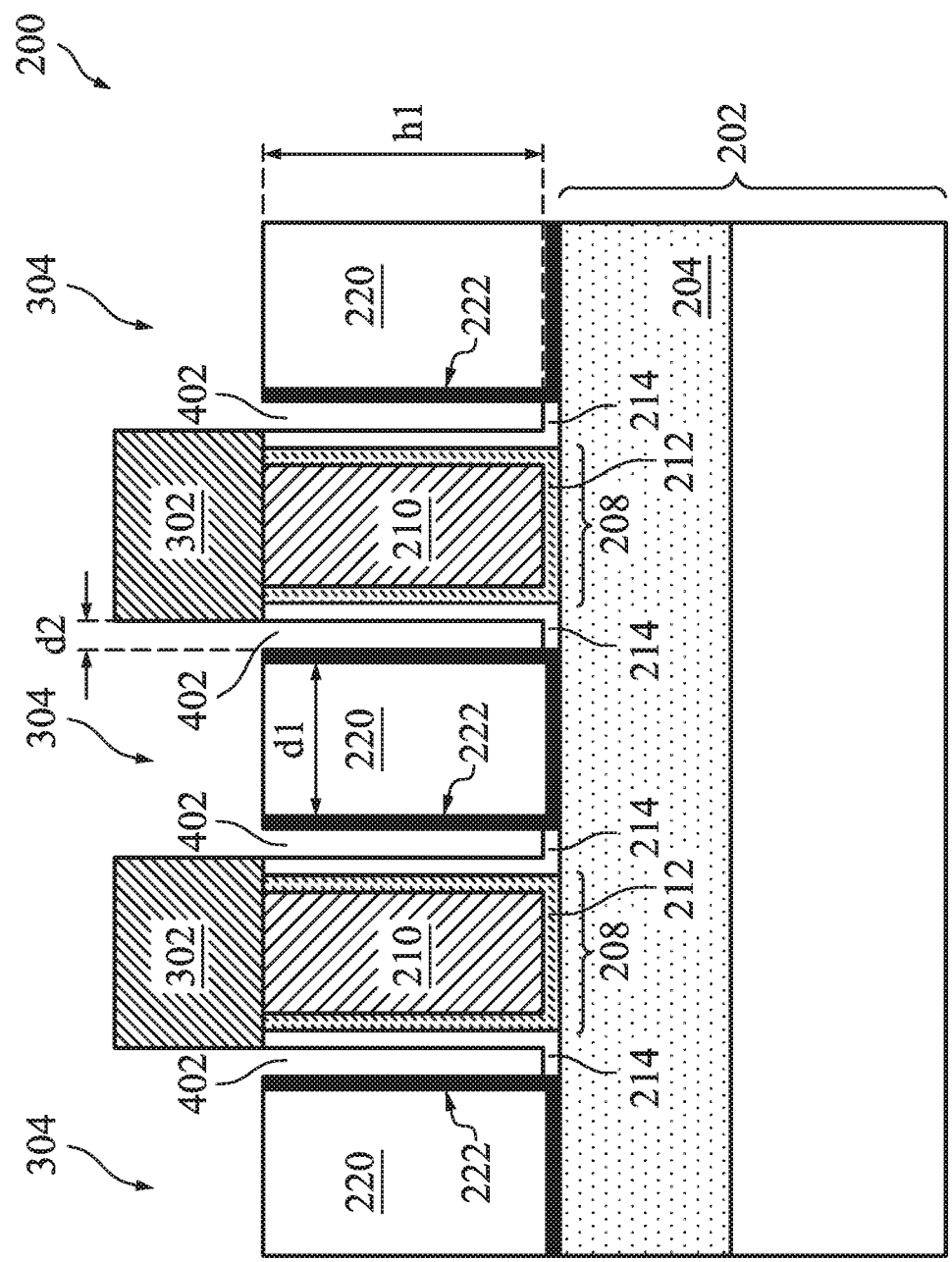
FIGS. 4, 5, 6, 7, 8 and 9 are cross-sectional views of the semiconductor structure at various fabrication stages constructed according to some embodiments.

Referring to FIG. 4, the method 100 proceeds to an operation 122 by removing the outer gate spacer 216, resulting in an air gap 402 between the inner gate spacer 214 and the ILD layer 220. FIG. 4 is a sectional view of the semiconductor structure 200 along the X direction on the STI feature 204 (along the dashed line AA' of FIG. 3 but at a different fabrication stage where the air gap 402 is formed by the operation 122). In some embodiments, the outer gate spacer 216 is removed by an etching process using the patterned mask layer 302 as an etch mask such that only the portions of the outer gate spacer 216 on the STI features 204 are removed but the portions of the outer gate spacer 216 within the fin active regions 206 remain. The ILD layer 220 between the adjacent gate stacks 208 spans a width d1. The air gap 402 has a height h1 and a width d2. In some examples, the ratio d2/d1 is greater than 10%. In some examples, the ratio d2/d1 ranges between 10% and 30%. In yet some examples, the height h1 is less than 200 nm; the width d1 ranges between 5 nm and 50 nm; and the width d2 is less than 10 nm.

The etching process may be dry etch, wet etch, or a combination thereof. The openings 304 of the patterned mask layer 302 are designed to define the regions to form the air gaps but the etching process is still designed with etch selectivity to other features, such as the inner gate spacer 214, the etch stop layer 222, and even the ILD layer 220. Furthermore, the composition of the outer gate spacer 216 is different from the compositions of those features, and the etching process chooses an etchant to selectively remove the outer gate spacer 216 without substantially etching to other features including such as the inner gate spacer 214 and the etch stop layer 222.

Figure 5:
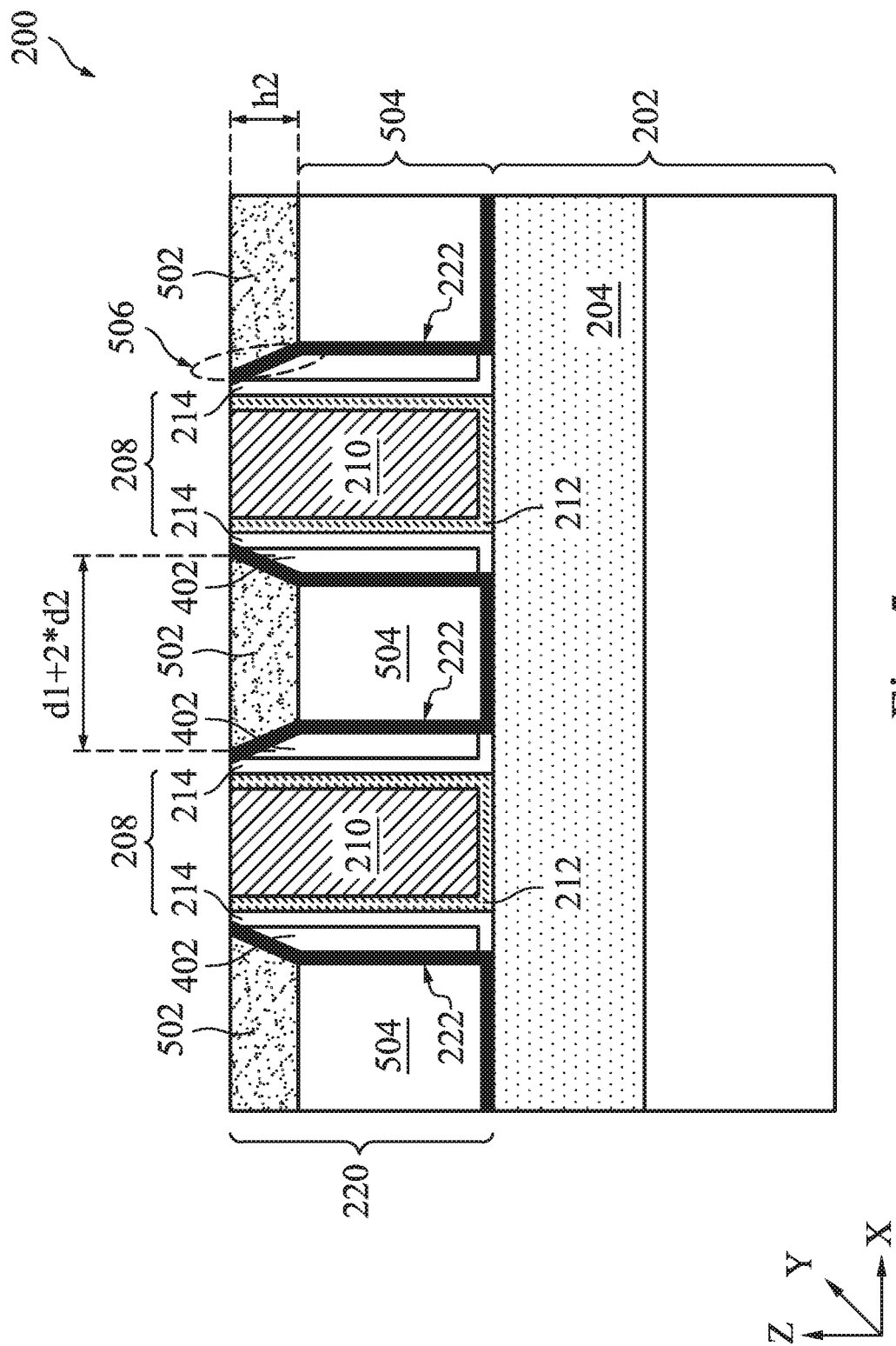

Referring to FIG. 5, the method 100 proceeds to an operation 124 by performing an ion implantation process to the ILD layer 220, thereby expanding the ILD layer 220 to cap the air gap 402. The ion implantation process introduces one or more dopant to a top portion 502 of the ILD layer 220, coverts the top portion 502 into the implanted portion, and leaves a bottom portion 504 of the ILD layer 220 as an nonimplanted portion. The ion implantation process increases the volume of the top portion 502, expands the top portion 502 laterally and seals the air gap 402. The expanded portion 506 of the top portion 502 servers as a cap to seal the air gap 402, therefore also referred to as expanded cap 506.

In some embodiments, the ion implantation process is performed using the patterned mask 302 to control the implantation only to the desired regions. The patterned mask layer 302 may be removed after the operation 124. When the top portion 502 of the ILD layer 220 is expanded, the corresponding portion of the etch stop layer 222 is pushed to reach the inner gate spacer 214, thereby capping the air gap 402.

The top portion 502 of the ILD layer 220 has a height h2 and a top width d1+2*d2 after the ion implantation process. The air gap 402 is defined between the ILD layer 220 and the gate stack 208. More specifically, the air gap 402 vertically and horizontally spans between the inner gate spacer 214 and the etch stop layer 222. To seal the air gap 402, the ILD layer 220 needs to be expanded at each edge by d2 to reach the inner gate spacer 214. In other words, the top surface of the ILD layer horizontally expands from the original width d1 to an expanded width d1+2*d2. The expanded volume is proportional to d2/d1. For example, if the expanded portion over the air gap 402 is a triangle, then the final volume over the original volume of the top portion 502 equals to (d1+d2)/d1. The volume expansion of the top portion 502 of the ILD layer 220 is associated with the dopant concentration and, in some embodiment, is proportional to the dopant concentration. For example, if the relative volume expansion of the top portion 502 can reach d2/d1, then the air gap will be sealed. In the present embodiment, the ratio d2/d1 is greater than 10%, or ranges from 10% to 30% according to some embodiments. The ion implantation process is designed to have dopant concentration high enough to ensure that the air gap 402 is sealed by expansion. In some embodiments, the dopant concentration is controlled by a combination of ion beam current and implantation duration of the ion implantation process to expand the ILD layer 220 (such as more 10%) such that the air gap 402 is sealed. Accordingly, the ion implantation process has a high dosage, such as the dopant concentration in the top portion 502 ranging from 1E11 to 1E17 atoms/cm2, in accordance with some embodiments.

Figure 6:
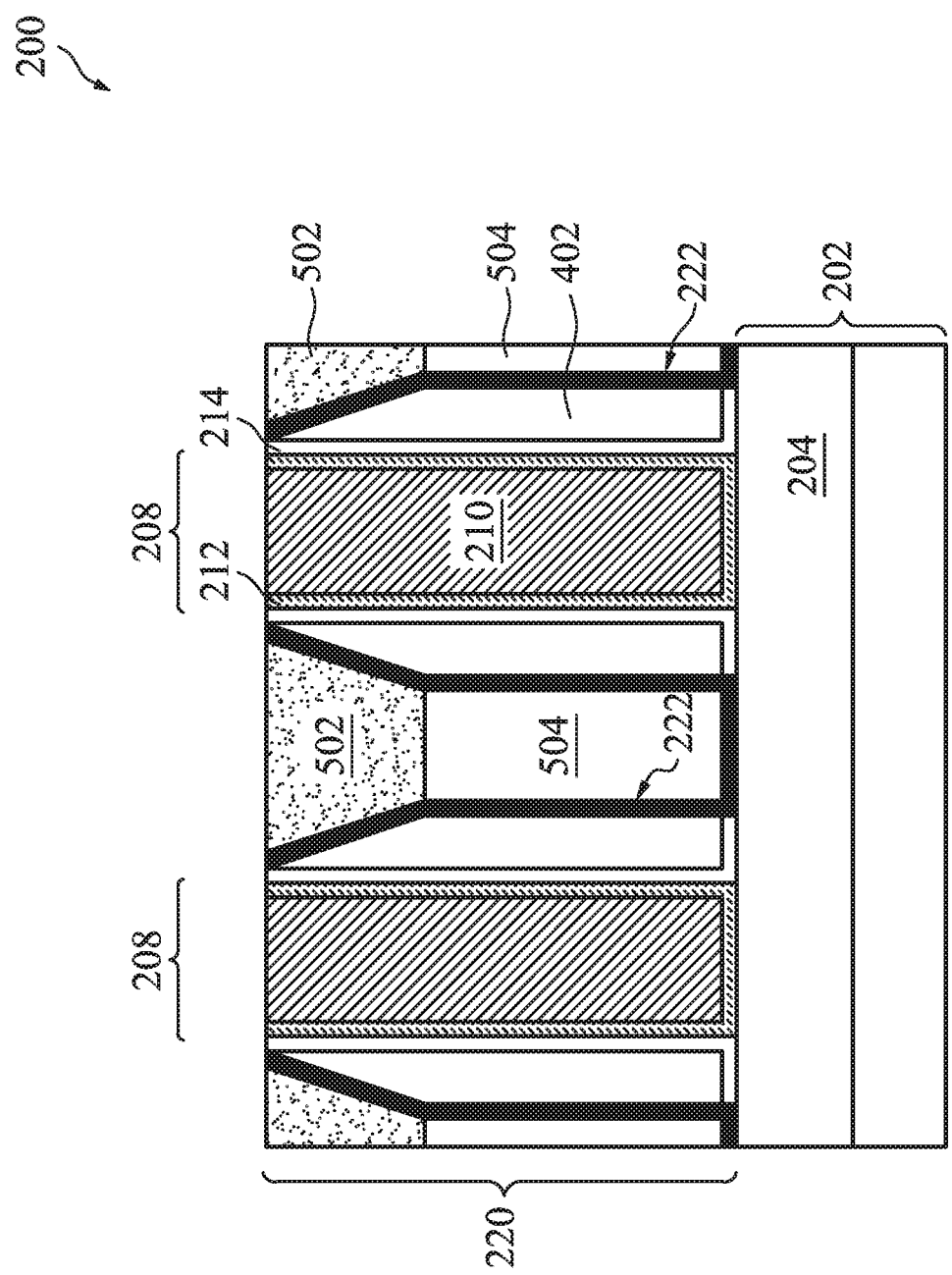

In some embodiments, the ion implantation process is performed by varying an implantation tilt angle from 60° to −60° while the semiconductor substrate 202 rotates for implantations at various directions, controlling the shape of expanded cap 506 of the top portion 502 of the ILD layer 220. The shape of expanded cap 506 is also related to the height h2 of the top portion 502, which is controlled by the implantation energy. The height h2 is controlled to a range, such as less than 50 nm, for maximized volume of the air gap 402 and with effective sealing effect. By controlling a combination of the dosage, the ion beam current, the implantation duration, the implantation energy, and the implantation tilt angle, the ILD layer 220 expands to effectively seal the air gap 402 and can achieve various shape of the expanded cap 506, such as a triangle shape as illustrated in FIG. 6; or a square shape as illustrated in FIG. 7; or a bowing shape as illustrated in FIG. 8.

In some embodiment, the ion implantation process includes introducing into the ILD layer 220 a first dopant species selected from nickel (Ni), fluorine (F), boron fluoride (BF), germanium (Ge), cobalt (Co), argon (Ar), arsenic (As), gallium (Ga), antimony (Sb), indium (In), and a combination thereof. In some embodiment, the ion implantation process includes introducing the first dopant species and additionally introducing a second t dopant species selected from carbon (C), phosphorous (P), silicon (Si), hydrogen (H), nitrogen (N), oxygen (O), and a combination thereof. In this case, the collective dopant concentration in the top portion 502 may range from 1E11 to 1E17 atoms/cm2, in accordance with some embodiments.

In other method, an air gap may be sealed by deposition. If the deposited sealing film has a good uniformity, the sealing film will fill in the air gap and destroys the air gap. If the deposited sealing film has a poor uniformity, the sealing film will experience a loading effect, by which the sealing film fills in the air gap unevenly when the pattern density is uneven. By the disclosed method, the air gap is sealed by expanding the ILD layer laterally when the dopant is introduced into the ILD layer by an ion implantation process. Furthermore, the ion implantation process is designed through a combination of the ion beam current, the implantation duration, the implantation energy, and the implantation tilt angle such that the ILD layer 220 expands to seal the air gap 402 effectively and has the volume of the air gap 402 maximized. By tuning the combination of the above processing parameters, the top portion 502 of the ILD layer 220 is expanded to form the expanded cap 506 having various shapes, such as a triangle shape as illustrated in FIG. 6; or a square shape as illustrated in FIG. 7; or a bowing shape as illustrated in FIG. 8, to balance the sealing effect and the air gap volume. For example, the triangle shape in FIG. 6 has largest air gap volume, the square shape in FIG. 7 has greatest sealing effect, and the bowing shape in FIG. 8 has an air gap volume greater than that of FIG. 7 and a sealing effect better than that of FIG. 6.

The method 100 may include other operations before, during or after the above described operations. For example, the method 100 includes an operation 126 to form contacts 902 landing on the S/D features 218, as illustrated in FIG. 9. Note that FIG. 9 is a sectional view of the semiconductor structure 200 cut along the fin active region 206 wherein the ILD layer 220 is not implanted and therefore is not expanded. The contacts 902 are conductive features electrically connecting the corresponding S/D features 218 to the overlying interconnection structure 904 to form an integrated circuit. The contacts 902 include a plug of a conductive material (including metal and metal alloy), such as tungsten (W), aluminum (Al), aluminum alloy, copper (Cu), cobalt (Co), nickel (Ni), other suitable metal/metal alloy, or a combination thereof. Note that the ILD layer 220 within the fin active regions 206 is not implanted and is not expanded. In some embodiments, the contacts 902 further includes a barrier layer lining the contact holes to enhance the material integration, such as increasing adhesion and reducing inter-diffusion. The barrier layer may include more than one film, such as titanium and titanium nitride (Ti/TiN), tantalum and tantalum nitride (Ta/TaN), copper silicide, or other suitable material. The formation of the contacts 902 includes patterning the ILD layer 220 to form contact holes; depositing a barrier layer to lining the contact holes, depositing of conductive material(s) on the barrier layer within the contact holes; and performing a CMP process to remove excessive conductive material and planarize the top surface according to some embodiments.

The method 100 may also include an operation 128 by forming the interconnection structure 904 on the semiconductor structure 200. The interconnection structure 904 includes various conductive features to couple the various device features (such as the gate stacks 208 and the S/D features 218) to form a functional circuit. Particularly, the interconnection structure 904 includes multiple metal layers to provide horizontal electrical routing and vias to provide vertical electrical routing. The interconnection structure 904 also includes multiple ILD layers 906 to isolate various conductive features from each other. For example, the Multiple ILD layers 906 may include low-k dielectric material or other suitable dielectric materials, such as silicon oxide. In some examples for illustration, the interconnection structure 904 includes a first metal layer 910, a second metal layer 914 over the first metal layer 910, and a third metal layer 918 over the second metal layer 914. Each metal layer includes a plurality of metal lines. The interconnection structure 904 further includes vias 908, 912 and 916 to provide vertical connections between metal lines in adjacent metal layers or between the first metal lines of the first metal layer 910 and devices (such as the gate stacks 208 or contacts 902 of the S/D features 218). In various embodiments, the conductive features (such as metal lines and vias) of the interconnection structure 904 includes aluminum, copper, aluminum/silicon/copper alloy, titanium, titanium nitride, tungsten, polysilicon, metal silicide, or combinations. The interconnection structure 904 may use aluminum interconnection formed by deposition and etching, or copper interconnection formed by damascene process. In the copper interconnection, the conductive features include copper and may further include a barrier layer. The copper interconnect structure is formed by a damascene process. A damascene process includes depositing an ILD layer; patterning the ILD layer to form trenches; depositing various conductive materials (such as a barrier layer and copper); and performing a CMP process.

In the method 100, a lithography process and a patterned hard mask are used in different operations and collectively described below. The patterned mask layer may be a hard mask that is deposited and is patterned. The hard mask includes a dielectric material such as semiconductor oxide, semiconductor nitride, semiconductor oxynitride, semiconductor carbide, or a combination thereof. The hard mask layer may be formed by thermal growth, atomic layer deposition (ALD), chemical vapor deposition (CVD), high density plasma CVD (HDP-CVD), other suitable deposition processes. The formation of the hard mask includes deposition, forming a patterned photoresist layer, and etching the hard mask using the patterned photoresist layer as an etch mask. The etching process to pattern the hard mask layer may include wet etching, dry etching or a combination thereof. For example, the silicon oxide film in the hard mask layer may be etched by a diluted hydro-fluorine solution and the silicon nitride film in the hard mask layer may be etched by a phosphoric acid solution.

A photoresist layer includes a photosensitive material that causes the photoresist layer to undergo a property change (such as chemical change) when exposed to light, such as ultraviolet (UV) light, deep UV (DUV) light or extreme UV (EUV) light. This property change can be used to selectively remove exposed or unexposed portions of the resist layer by a developing process referred. This procedure to form a patterned resist layer is referred to as a lithography process. A lithography process may include spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing.

A semiconductor structure with an air gap and a method making the same are disclosed. The method includes removing the outer gate spacer to form an air gap; and performing an ion implantation process to introduce one or more dopant species to the ILD layer, thereby expanding the ILD layer to cap the air gap. Various advantages may be present in various applications of the present disclosure. No particular advantage is required for all embodiments, and that different embodiments may offer different advantages. One of the advantages in some embodiments is that the air gap is sealed without deposition to achieve optimized sealing effect and increased volume of the air gap. Furthermore, the ion implantation process is designed through a combination of the ion beam current, the implantation duration, the implantation energy, and the implantation tilt angle such that the ILD layer expands to seal the air gap effectively and has the volume of the air gap 402 maximized. By tuning the combination of the above processing parameters, the expanded cap of the ILD layer can have various shapes, such as a triangle shape; or a square shape; or a bowing shape to balance the sealing effect and the air gap volume.

Thus, the present disclosure provides a method of fabricating a semiconductor structure in accordance with some embodiments. The method includes receiving a substrate having an active region and an isolation region; forming gate stacks on the substrate and extending from the active region to the isolation region; forming an inner gate spacer and an outer gate spacer on sidewalls of the gate stacks; forming an ILD layer on the substrate; removing the outer gate spacer in the isolation region, resulting in an air gap between the inner gate spacer and the ILD layer; and performing an ion implantation process to the ILD layer, thereby expanding the ILD layer to cap the air gap.

The present disclosure also provides a method in accordance with some embodiments. The method includes receiving a substrate having a STI feature and an active region, a gate stack on the substrate, an inner gate spacer and an outer gate spacer on sidewalls of the gate stacks, and forming an ILD layer on the substrate, wherein the gate stack extends from the active region to the STI feature. The method further includes removing a portion of the outer gate spacer on the STI feature, resulting in an air gap between the inner gate spacer and the ILD layer; and performing an ion implantation process to the ILD layer, thereby expanding the ILD layer to cap the air gap.

The present disclosure further provides a semiconductor structure in accordance with some embodiments. The semiconductor structure includes a substrate having an active region and an isolation region; gate stacks on the substrate and extending from the active region to the isolation region; a gate spacer on sidewalls of the gate stacks; and an ILD layer on the substrate and defining an air gap between the ILD layer and the gate spacer, wherein the ILD layer includes a top portion laterally extends to the gate spacer and caps the air gap.

Although the present disclosure and advantages of some embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a semiconductor structure, comprising:
   receiving a substrate having an active region and an isolation region;
   forming gate stacks on the substrate and extending from the active region to the isolation region;
   forming an inner gate spacer and an outer gate spacer on sidewalls of the gate stacks;
   forming an interlevel dielectric (ILD) layer on the substrate;
   removing the outer gate spacer in the isolation region, resulting in an air gap between the inner gate spacer and the ILD layer; and
   thereafter performing an ion implantation process to the ILD layer, thereby expanding the ILD layer to cap the air gap.

2. The method of claim 1, wherein the performing of the ion implantation process includes performing a first ion implantation process to introduce into the ILD layer a dopant species selected from nickel (Ni), fluorine (F), boron fluoride (BF), germanium (Ge), cobalt (Co), argon (Ar), arsenic (As), gallium (Ga), antimony (Sb), indium (In), and a combination thereof.

3. The method of claim 2, wherein the performing of the ion implantation process includes additionally performing a second ion implantation process to introduce into the ILD layer a dopant species selected from carbon (C) phosphorous (P), silicon (Si), hydrogen (H), nitrogen (N), oxygen (O), and a combination thereof.

4. The method of claim 1, wherein the performing of the ion implantation process includes performing the ion implantation process using a high dosage with a dopant concentration ranging from 1E11 to 1E17 atoms/cm$^2$.

5. The method of claim 1, further comprising forming a patterned material layer with an opening to expose the ILD layer and the outer gate spacer within the isolation region before the removing of the outer gate spacer in the isolation region, wherein the removing of the outer gate spacer in the isolation region includes performing an etching process to selectively remove the outer gate spacer through the opening of the patterned material layer.

6. The method of claim 5, wherein the performing of the ion implantation process includes performing of the ion implantation process to the ILD layer through the opening of the patterned material layer.

7. The method of claim 1, wherein the forming of the inner gate spacer and the outer gate spacer includes
   depositing a first dielectric material layer on the substrate and gate stacks;
   depositing a second dielectric material layer on the first dielectric material layer, the second dielectric material layer being different from the first dielectric material layer in composition; and
   performing an anisotropic etching process to the first and second dielectric material layers.

8. The method of claim 7, wherein the forming the ILD layer includes
   forming an etch stop layer on the substrate and sidewalls of the outer gate spacer;
   forming a third dielectric material layer on the etching stop layer, the third dielectric material layer being different from the etch stop layer in composition; and
   performing a chemical mechanic polishing process to the third dielectric material layer.

9. The method of claim 8, wherein the third dielectric material layer includes one of SiN, SiOC, SiOCN, SiCN, Si, SiGe, W, TiN, $HfO_2$, $ZrO_2$, $La_2O_3$, and a combination thereof.

10. A method of fabricating a semiconductor structure, comprising:
    receiving a substrate having a shallow trench isolation (STI) feature and an active region, a gate stack on the substrate, an inner gate spacer and an outer gate spacer on sidewalls of the gate stacks, and an interlevel dielectric (ILD) layer on the substrate, wherein the gate stack extends from the active region onto the STI feature;
    removing a portion of the outer gate spacer on the STI feature, resulting in an air gap between the inner gate spacer and the ILD layer; and
    thereafter performing an ion implantation process to the ILD layer, thereby expanding the ILD layer to cap the air gap.

11. The method of claim 10, wherein the performing of the ion implantation process includes performing the ion implantation process to introduce into the ILD layer a first dopant species and a second dopant species, wherein the first dopant species is selected from nickel (Ni), fluorine (F), boron fluoride (BF), germanium (Ge), cobalt (Co), argon (Ar), arsenic (As), gallium (Ga), antimony (Sb), indium (In), and a combination thereof; and the second dopant species is selected from carbon (C) phosphorous (P), silicon (Si), hydrogen (H), nitrogen (N), oxygen (O), and a combination thereof.

12. The method of claim 11, wherein the performing of the ion implantation process includes performing the ion implantation process using a high dosage with a collective dopant concentration ranging from 1E11 to 1E17 atoms/$cm^2$.

13. The method of claim 10, further comprising forming a patterned material layer with an opening to expose a portion of the ILD layer and the portion of the outer gate spacer on the STI feature, wherein the removing of the portion of the outer gate spacer includes performing an etching process to selectively etch the portion of the outer gate spacer through the opening of the patterned material layer.

14. The method of claim 13, wherein the performing of the ion implantation process includes performing the ion implantation process to the portion of the ILD layer through the opening of the patterned material layer.

15. The method of claim 14, wherein the performing of the ion implantation process includes performing the ion implantation process by varying an implantation tilt angle from 60° to −60° while the substrate rotates.

16. The method of claim 10, wherein the performing of the ion implantation process includes performing the ion implantation process with an ion beam current and an implantation duration to expand the ILD layer laterally more than 10%.

17. A semiconductor structure, comprising:
    a substrate having an active region and an isolation region;
    gate stacks on the substrate and extending from the active region to the isolation region;
    a gate spacer on sidewalls of the gate stacks; and
    an interlevel dielectric (ILD) layer on the substrate and defining an air gap between the ILD layer and the gate spacer, wherein the ILD layer includes a top portion laterally extends to the gate spacer and caps the air gap, wherein the air gap is within the isolation region and is not extended to the active region.

18. The semiconductor structure of claim 17, wherein the ILD layer includes a bottom portion and the top portion;
    the bottom portion of the ILD layer includes a dielectric material; and
    the top portion of the ILD includes the dielectric material doped with one of nickel (Ni), fluorine (F), boron fluoride (BF), germanium (Ge), cobalt (Co), argon (Ar), arsenic (As), gallium (Ga), antimony (Sb), indium (In), and a combination thereof.

19. The semiconductor structure of claim 18, wherein the top portion of the ILD layer has a bowing shape over the air gap.

20. The semiconductor structure of claim 18, wherein the ILD layer extends to source/drain (S/D) features on the active region;
    the ILD layer further includes an etch stop layer on the substrate;
    a dielectric material layer on the etching stop layer; and
    the dielectric material layer is different from the etch stop layer in composition.

* * * * *